(12) United States Patent
Hulse

(10) Patent No.: US 7,663,315 B1
(45) Date of Patent: Feb. 16, 2010

(54) SPHERICAL BULB FOR LIGHT-EMITTING DIODE WITH SPHERICAL INNER CAVITY

(75) Inventor: George R. Hulse, Arlington Heights, IL (US)

(73) Assignee: iLight Technologies, Inc., Chicago, IL (US)

( * ) Notice: Subject to any disclaimer, the term of this patent is extended or adjusted under 35 U.S.C. 154(b) by 218 days.

(21) Appl. No.: 11/945,778

(22) Filed: Nov. 27, 2007

Related U.S. Application Data

(63) Continuation-in-part of application No. 11/945,691, filed on Nov. 27, 2007.

(60) Provisional application No. 60/951,581, filed on Jul. 24, 2007.

(51) Int. Cl.
*H01J 63/04* (2006.01)
(52) U.S. Cl. ...................................... 313/512
(58) Field of Classification Search .................. 313/512, 313/498
See application file for complete search history.

(56) References Cited

U.S. PATENT DOCUMENTS

| | | | |
|---|---|---|---|
| 2,681,861 A * | 6/1954 | Hushley | ...................... 501/77 |
| 4,667,481 A | 5/1987 | Watanabe et al. | |
| 5,642,933 A | 7/1997 | Hitora | |
| 5,769,532 A | 6/1998 | Sasaki | |
| 5,786,665 A | 7/1998 | Ohtsuki et al. | |
| 5,803,579 A | 9/1998 | Turnbull et al. | |
| 6,102,559 A | 8/2000 | Nold et al. | |
| 6,132,072 A | 10/2000 | Turnbull et al. | |
| 6,132,345 A | 10/2000 | Beierschmitt et al. | |
| 6,155,699 A | 12/2000 | Miller et al. | |
| 6,227,679 B1 | 5/2001 | Zhang et al. | |
| 6,244,727 B1 | 6/2001 | Ryan, Jr. et al. | |
| 6,305,813 B1 | 10/2001 | Lekson et al. | |
| 6,307,987 B1 * | 10/2001 | Wang et al. | .................... 385/31 |
| 6,371,637 B1 | 4/2002 | Atchinson et al. | |
| 6,404,131 B1 | 6/2002 | Kawano et al. | |
| 6,409,361 B1 | 6/2002 | Ikeda | |
| 6,415,531 B1 | 7/2002 | Ohtsuki et al. | |
| 6,471,371 B1 | 10/2002 | Kawashima et al. | |

(Continued)

FOREIGN PATENT DOCUMENTS

DE 4003539 8/1991

(Continued)

OTHER PUBLICATIONS

ISA/US, Search Report and Written Opinion for International Application No. PCT/US08/50277, mailed Jun. 30, 2008.

*Primary Examiner*—Toan Ton
*Assistant Examiner*—Hana A Sanei
(74) *Attorney, Agent, or Firm*—Stites & Harbison, PLLC; David W. Nagle, Jr.

(57) ABSTRACT

A bulb is adapted to fit over and around a light-emitting diode emitting a light of a first hue in a generally Lambertian radiation pattern. The bulb has a generally spherical shape and a substantially circular external cross-sectional geometry, and further defines an inner cavity with a substantially circular cross-sectional geometry for housing the light-emitting diode. The bulb is composed of a light-transmitting material and a light color-converting material, with the light color-converting material converting the light of the first hue into a light of a desired hue, which is then viewed along an external surface of said bulb.

7 Claims, 3 Drawing Sheets

U.S. PATENT DOCUMENTS

| | | |
|---|---|---|
| 6,521,916 B2 | 2/2003 | Roberts et al. |
| 6,523,976 B1 | 2/2003 | Turnbull et al. |
| 6,536,914 B2 | 3/2003 | Hoelen et al. |
| 6,550,949 B1 | 4/2003 | Bauer et al. |
| 6,577,073 B2 | 6/2003 | Shimizu et al. |
| 6,592,238 B2 | 7/2003 | Hulse et al. |
| 6,609,804 B2 | 8/2003 | Nolan et al. |
| 6,641,284 B2 | 11/2003 | Stopa et al. |
| 6,657,382 B2 | 12/2003 | Nagai et al. |
| 6,709,132 B2 | 3/2004 | Ishibashi |
| 6,762,562 B2 | 7/2004 | Leong |
| 6,800,996 B2 | 10/2004 | Nagai et al. |
| 6,834,979 B1 | 12/2004 | Cleaver et al. |
| 6,953,262 B2 | 10/2005 | Hulse et al. |
| 7,005,679 B2 | 2/2006 | Tarsa et al. |
| 7,008,079 B2 | 3/2006 | Smith |
| 7,011,421 B2 | 3/2006 | Hulse et al. |
| 7,021,797 B2 | 4/2006 | Minano et al. |
| 7,036,956 B1 | 5/2006 | Chou |
| 7,086,756 B2 | 8/2006 | Maxik |
| 7,134,770 B2 | 11/2006 | Barlian et al. |
| 7,157,839 B2 | 1/2007 | Ouderkirk et al. |
| 7,158,020 B2 | 1/2007 | Grady, Jr. |
| 7,168,823 B1 | 1/2007 | Jones |
| 7,187,011 B2 | 3/2007 | Tasch et al. |
| 7,188,970 B2 | 3/2007 | Hulse et al. |
| 7,205,719 B2 | 4/2007 | Tain et al. |
| 7,206,507 B2 | 4/2007 | Lee et al. |
| 7,264,366 B2 | 9/2007 | Hulse |
| 7,264,367 B2 | 9/2007 | Hulse |
| 2001/0033488 A1 | 10/2001 | Chliwnyj et al. |
| 2001/0046131 A1 | 11/2001 | Hoelen et al. |
| 2002/0003700 A1 | 1/2002 | Selkee |
| 2002/0030992 A1 | 3/2002 | Lefebvre et al. |
| 2003/0002272 A1 | 1/2003 | Suchiro et al. |
| 2003/0174504 A1 | 9/2003 | Tamaoki |
| 2003/0198049 A1 | 10/2003 | Hulse et al. |
| 2003/0210552 A1 | 11/2003 | Barlian et al. |
| 2004/0027834 A1 | 2/2004 | Chigusa et al. |
| 2004/0057234 A1 | 3/2004 | Mohacsi |
| 2004/0080938 A1 | 4/2004 | Holman et al. |
| 2004/0095078 A1 * | 5/2004 | Leong ........................ 315/291 |
| 2004/0145895 A1 | 7/2004 | Ouderkirk et al. |
| 2004/0150991 A1 | 8/2004 | Ouderkirk et al. |
| 2004/0196643 A1 | 10/2004 | Terada et al. |
| 2004/0207341 A1 | 10/2004 | Callahan |
| 2005/0052871 A1 | 3/2005 | Leu et al. |
| 2005/0057917 A1 | 3/2005 | Yatsuda |
| 2005/0168987 A1 | 8/2005 | Tamaoki et al. |
| 2005/0195603 A1 | 9/2005 | Hulse |
| 2005/0243550 A1 | 11/2005 | Stekelenburg |
| 2006/0028837 A1 | 2/2006 | Mrakovich |
| 2006/0039143 A1 | 2/2006 | Katoh et al. |
| 2006/0082999 A1 | 4/2006 | Klein |
| 2006/0138440 A1 | 6/2006 | Jyo |
| 2006/0152139 A1 | 7/2006 | Hsieh et al. |
| 2006/0193121 A1 | 8/2006 | Kamoshita |
| 2006/0198119 A1 | 9/2006 | Hulse et al. |
| 2006/0221594 A1 | 10/2006 | Thuot Rann et al. |
| 2006/0262539 A1 | 11/2006 | Goulet et al. |
| 2006/0289884 A1 | 12/2006 | Soules et al. |
| 2007/0023763 A1 | 2/2007 | Takigawa et al. |
| 2007/0024191 A1 | 2/2007 | Chen et al. |
| 2007/0047227 A1 | 3/2007 | Ducharme |
| 2007/0120135 A1 | 5/2007 | Soules et al. |
| 2007/0215890 A1 | 9/2007 | Harbers et al. |
| 2007/0267976 A1 | 11/2007 | Bohler et al. |
| 2008/0246044 A1 | 10/2008 | Pang |

FOREIGN PATENT DOCUMENTS

| | | |
|---|---|---|
| EP | 0982532 | 3/2000 |
| EP | 1748498 | 1/2007 |
| JP | 2005197717 | 1/2007 |
| JP | 2007005091 | 1/2007 |
| JP | 2007005372 | 1/2007 |
| JP | 2007005522 | 1/2007 |
| JP | 2007005549 | 1/2007 |
| JP | 2007018815 | 1/2007 |
| JP | 2007035802 | 2/2007 |
| JP | 2007103160 | 4/2007 |
| WO | 0131255 | 5/2001 |
| WO | 0208799 | 1/2002 |
| WO | WO 2004100213 A2 * | 11/2004 |
| WO | 2006121625 | 11/2006 |
| WO | 2007075393 | 7/2007 |
| WO | 2007049187 | 11/2007 |

* cited by examiner

SPHERICAL BULB FOR LIGHT-EMITTING DIODE WITH SPHERICAL INNER CAVITY

CROSS-REFERENCE TO RELATED APPLICATIONS

The present application claims priority to U.S. Provisional Patent Application Ser. No. 60/951,581 filed on Jul. 24, 2007, and is also a continuation-in-part of U.S. patent application Ser. No. 11/945,691 filed on Nov. 27, 2007, which itself claims priority to U.S. Provisional Patent Application Ser. No. 60/884,638 filed on Jan. 12, 2007. The entire disclosures of each of these prior applications are incorporated herein by reference.

BACKGROUND OF THE INVENTION

The present invention is a generally spherical bulb that fits over and around an LED emitting light of a first hue in a generally Lambertian radiation pattern, converting the light emitted from the LED into light of a desired hue, with a substantially consistent and generally uniform hue then being observed along the external surface of the bulb.

Light-emitting diodes (LEDs) are now commonly used for a wide variety of general illumination and special effects illumination. For example, commonly assigned U.S. Pat. Nos. 6,592,238; 6,953,262; and 7,188,970, which are incorporated in their entirety herein by this reference, each describe an illumination device for simulating neon lighting having a plurality of spaced LEDs positioned adjacent the light-receiving surface of a rod-like member or waveguide. The rod-like member/waveguide is made of a material that preferentially scatters light entering the light-receiving surface such that the light intensity pattern exiting a light-emitting surface of the rod-like member/waveguide is substantially uniform.

Nevertheless, the available visible color spectrum for illumination devices that use LEDs is limited by the finite availability of LED colors. Therefore, in commonly assigned U.S. Pat. Nos. 7,011,421; 7,264,366; and 7,264,367, each of which is also incorporated herein by this reference, illumination devices are described that use LEDs in conjunction with fluorescent and/or phosphorescent dyes, allowing for the emission of light in hues that cannot ordinarily be achieved through the use of LEDs alone.

SUMMARY OF THE INVENTION

The present invention is a generally spherical bulb that fits over and around an LED emitting light of a first hue in a generally Lambertian radiation pattern, converting the light emitted from the LED into light of a desired hue, with a substantially consistent and generally uniform hue then being observed along the external surface of the bulb.

An exemplary bulb made in accordance with the present invention is composed of a light-transmitting material (such as a substantially translucent acrylic resin, polyurethane, or similar material) and a light color-converting material. The exemplary bulb has a generally spherical shape and a substantially circular external cross-sectional geometry. The exemplary bulb further defines an inner cavity that fits over and around an LED that emits light in a generally Lambertian radiation pattern. One suitable light-transmitting material is a translucent acrylic resin that scatters light as it passes through the material. The light color-converting material is some predetermined combination of one or more fluorescent dyes, phosphorescent dyes, and/or other dyes or colorants that are mixed into the light-transmitting material.

When the exemplary bulb is fit over and around an LED that emits light in a generally Lambertian radiation pattern, the LED emits light of a first hue into a light-receiving surface of the bulb. The light color-converting material in the exemplary bulb converts the light of the first hue into light of a desired hue, which is then observed over a light-emitting surface of the bulb. In order to ensure that the observed light has a substantially consistent and generally uniform hue over the light-emitting surface of the exemplary bulb, the geometry of the bulb is important. Specifically, Applicant has determined that, for a bulb with a spherical geometry that is placed over an LED emitting light in a generally Lambertian radiation pattern, the preferred geometry for the inner cavity that receives the LED is one that mirrors that of the external surface of the bulb, i.e., a sphere within a sphere. Accordingly, the exemplary bulb has a generally spherical shape and a substantially circular external cross-sectional geometry, and the inner cavity has a similar generally spherical shape and a substantially circular cross-sectional geometry.

DETAILED DESCRIPTION OF THE INVENTION

The present invention is a generally spherical bulb that fits over and around an LED emitting light of a first hue in a generally Lambertian radiation pattern, converting the light emitted from the LED into light of a desired hue, with a substantially consistent and generally uniform hue then being observed along the external surface of the bulb.

For purposes of the discussion that follows, it is important to recognize that most perceived "colors" are not representative of light of a single wavelength, but rather some combination of wavelengths. In this regard, the dominant or perceived color of light comprised of some combination of wavelengths is generally referred to as hue. In order to provide a mechanism to represent and identify all possible perceived colors, the Commission Internationale l'Eclairage (CIE) constructed the CIE Chromaticity Diagram, which is based on three ideal primary light colors of red, green, and blue. The CIE Chromaticity Diagram is a well-known tool for identifying colors and is well understood by one of ordinary skill in the art. Specifically, since the x-axis of this CIE Chromaticity Diagram represents the amount of ideal red that would be mixed with ideal blue, and the y-axis of the CIE Chromaticity Diagram represents the amount of ideal green that would be mixed with ideal blue, a desired color can be identified in terms of its x and y coordinates. It is also important to recognize that the chromaticity curve, which is representative of the visible spectrum, is commonly superimposed over the chart such that wavelengths within the visible spectrum are represented along this curve.

Furthermore, the CIE Chromaticity Diagram is also helpful in understanding mixtures of primary light colors. Specifically, if a straight line is drawn between two points on the chromaticity curve, for example from green with a wavelength of 510 nm to red with a wavelength of 700 nm, that straight line illustrates the range of colors that could be created and perceived by the human eye, depending on the relative amounts of primary light colors in the mixture, including various yellowish-green colors and oranges. It is also important to recognize that the central region of the CIE Chromaticity Diagram is representative of white, a combination of the three ideal primary light colors. If any straight line between two colors on the chromaticity curve passes through this central region, those two colors can be mixed to create a perceived white color.

Figure 1:
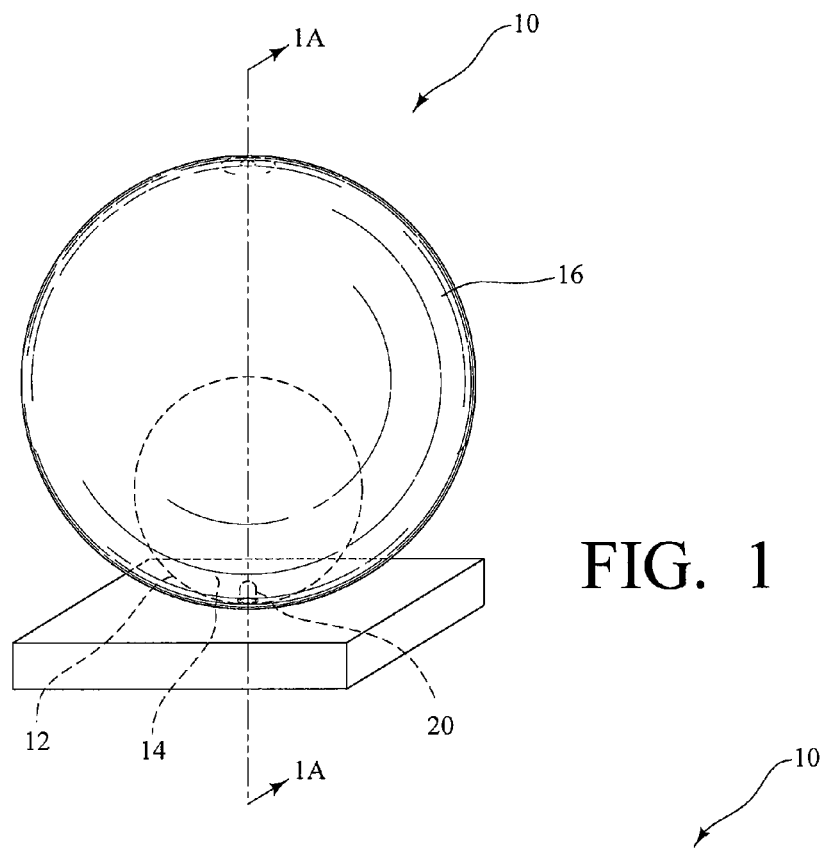
FIG. 1 is a perspective view of an exemplary bulb made in accordance with the present invention.
Figure 1A:
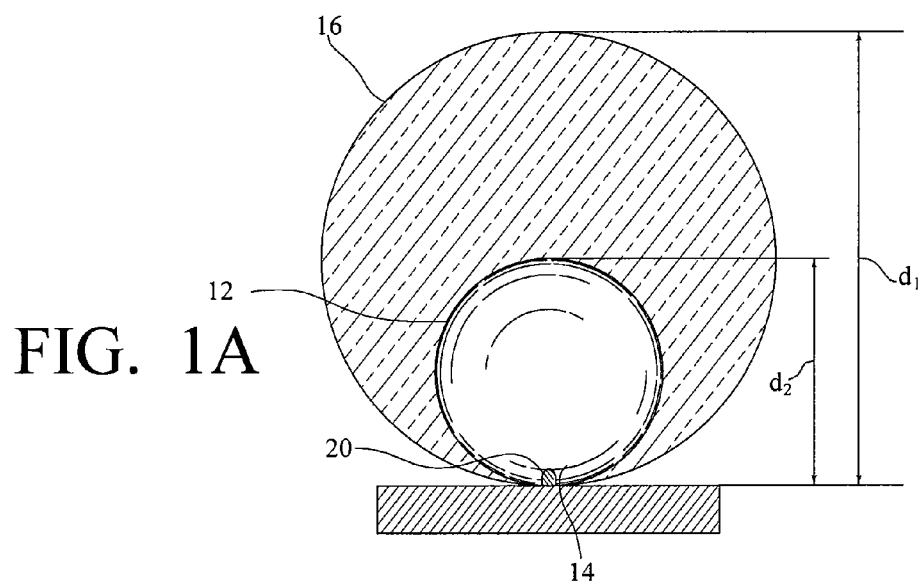
FIG. 1A is a sectional view of the exemplary bulb of FIG. 1, taken along line 1A-1A of FIG. 1.
Figure 2:
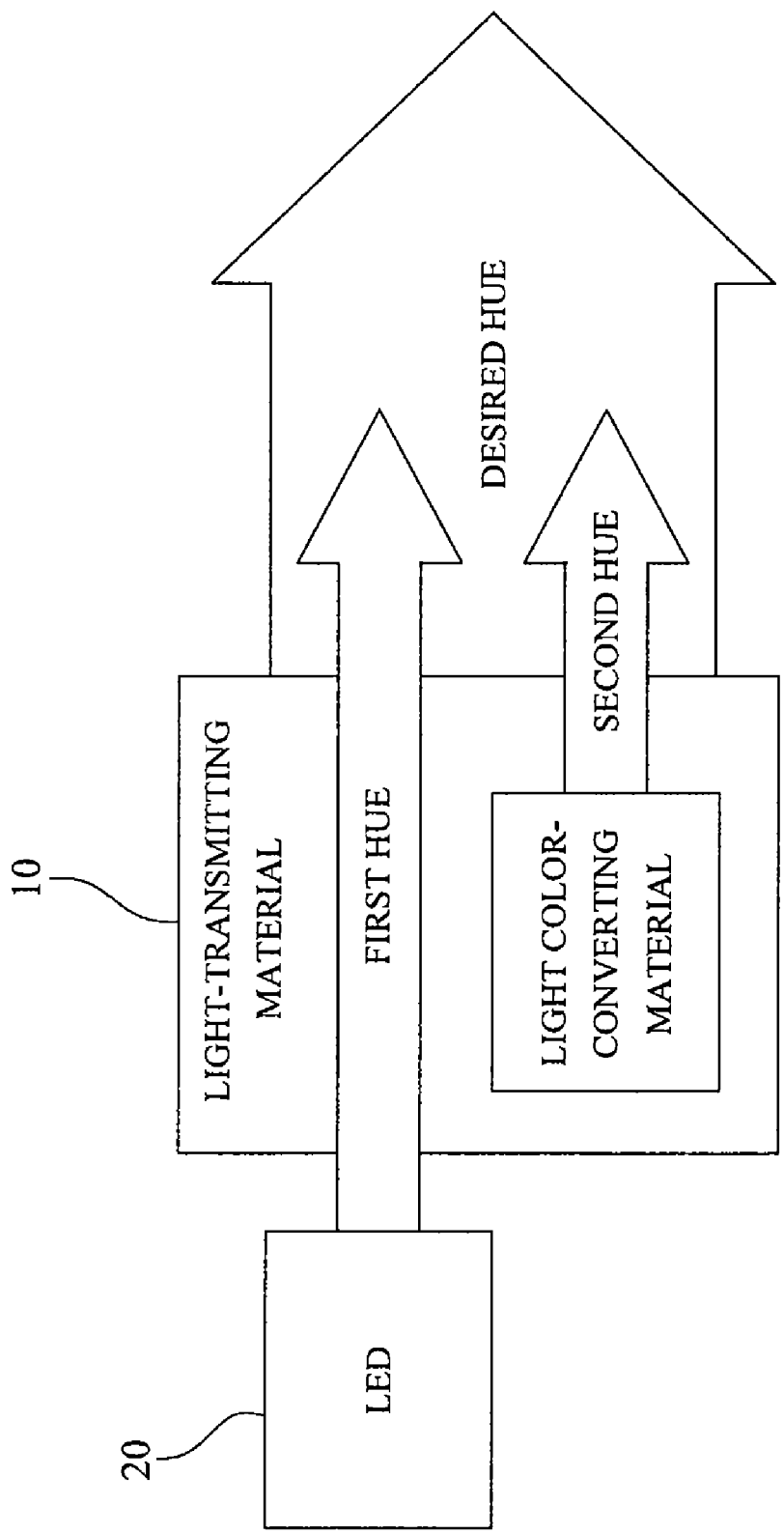
FIG. 2 is a block diagram illustrating the passage of light through the exemplary bulb of FIGS. 1 and 1A.

Returning to the present invention, and referring to FIGS. 1, 1A and 2, an exemplary bulb 10 made in accordance with the present invention is composed of a light-transmitting material (such as a substantially translucent acrylic resin, polyurethane, or similar material) and a light color-converting material. This exemplary bulb 10 has a generally spherical shape and a substantially circular external cross-sectional geometry. This exemplary bulb 10 defines an inner cavity 12 that fits over and around an LED 20 that emits light in a generally Lambertian radiation pattern. Such an LED generally obeys Lambert's Cosine Law, meaning there is substantially equal radiance in all directions such that the radiation pattern resembles a sphere. The bulb 10 further has a light-receiving surface 14 (within the inner cavity 12) and an external or light-emitting surface 16.

Applicant has discovered that one suitable light-transmitting material is a translucent acrylic resin, for example, Plexiglas® Frosted DR-66080 White TL, manufactured and distributed by Arkema, Inc. of Puteaux, France and Philadelphia, Pa. (Plexiglas® is a registered trademark of Arkema, Inc.). This particular material has an inherent haze value (i.e., a measure of the scattering of light as it passes through the material) of approximately 98% according to American Society for Testing Materials (ASTM) Test Method D1003.

When using such an acrylic resin, the light color-converting material may be some predetermined combination of one or more fluorescent dyes, phosphorescent dyes, and/or other dyes or colorants that are mixed into the light-transmitting material. For example, suitable fluorescent dyes include Lumogen™ F240 (orange), Lumogen™ F170 (yellow), Lumogen™ F285 (pink), and Lumogen™ 850 (green), each of which may be acquired from BASF Corporation of Mount Olive, N.J. Since these dyes are typically manufactured and distributed in powdered form, the dyes can be mixed with pellets of the acrylic resin in an appropriate ratio. The mixture is then preferably dried for removal of moisture, and the mixture can then be molded into the desired geometry.

In any event, when the exemplary bulb 10 is fit over and around the LED 20 that emits light in a generally Lambertian radiation pattern, the LED 20 emits light of a first hue into the light-receiving surface 14 of the bulb 10. The light color-converting material in the exemplary bulb 10 converts the light of the first hue into light of a desired hue, which is then observed over the light-emitting surface 16 of the bulb 10. However, in order to ensure that the observed light has a substantially consistent and generally uniform hue over the light-emitting surface 16 of the exemplary bulb 10, the geometry of the bulb is important. Specifically, Applicant has determined that, for a bulb with a spherical geometry that is placed over an LED emitting light in a generally Lambertian radiation pattern, the preferred geometry for the inner cavity that receives the LED is one that mirrors that of the external surface of the bulb, i.e., a sphere within a sphere. Accordingly, as illustrated in FIGS. 1 and 1A, the exemplary bulb 10 has a generally spherical shape and a substantially circular external cross-sectional geometry, and the inner cavity 12 has a similar generally spherical shape and a substantially circular cross-sectional geometry. Furthermore, the circle defined by the inner cavity 12 is tangent to the circle defined by the light-emitting surface 16 of the bulb 10, such that the circles meet at a single point of contact. The LED 20 is housed within the inner cavity 12 at or near this point of contact. In this configuration, with the geometry of the inner cavity 12 generally mirroring the external geometry of the bulb 10, there will be no appreciable effect on the consistency and uniformity of the hue over the light-emitting surface 16 of the bulb 10.

Figure 3:
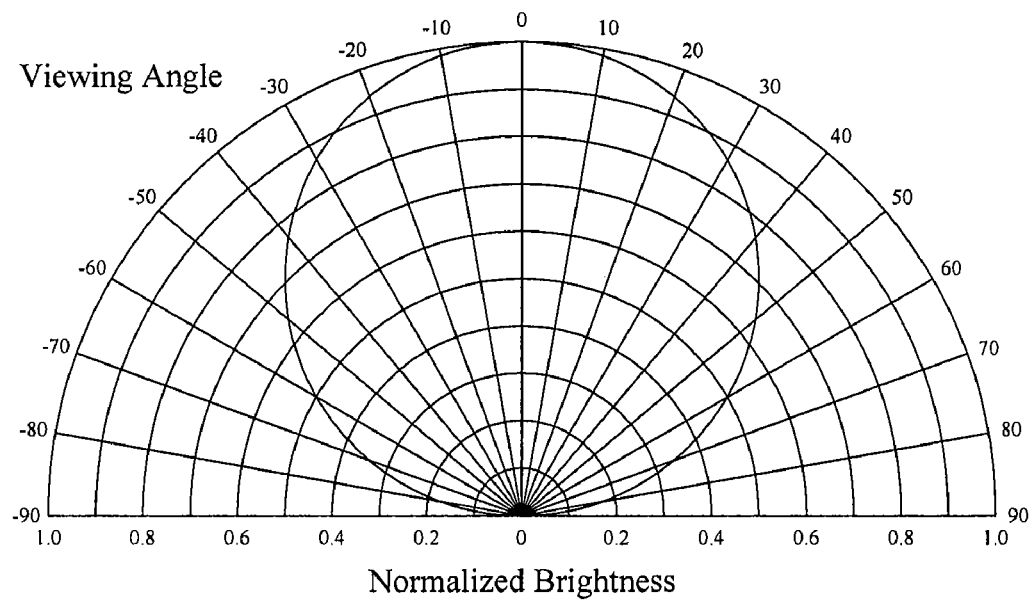
FIG. 3 is a polar plot showing the normalized brightness values depending on the viewing angle for a particular LED emitting light in a generally Lambertian radiation pattern.
Figure 4:
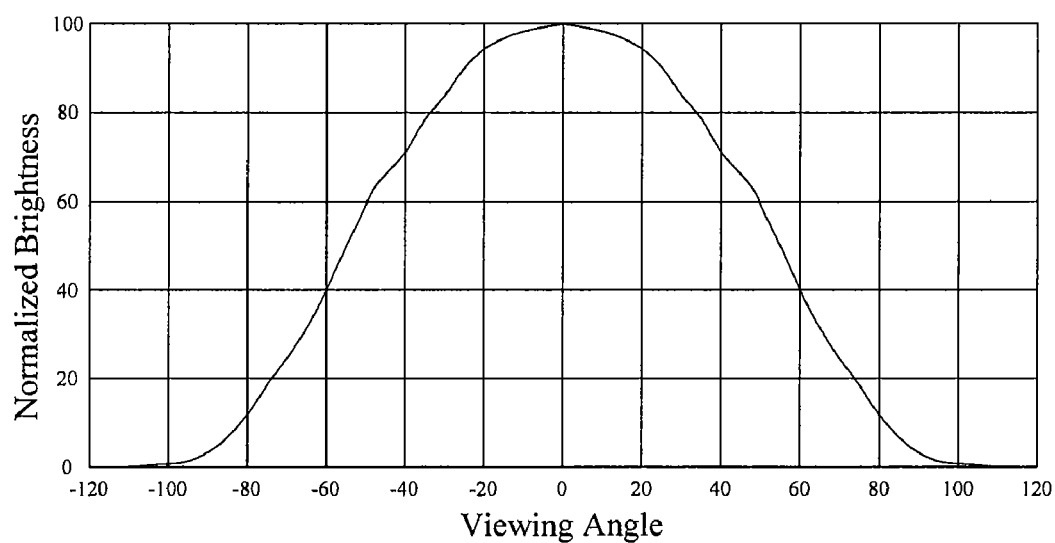
FIG. 4 is a graphical representation of the normalized brightness values depending on the viewing angle similar to FIG. 3, but on a Cartesian coordinate system.

For instance, Applicant has determined that one appropriate LED for use with the bulb 10 of the present invention is a 470-nm (blue) light-emitting diode distributed by Marktech Optoelectronics of Latham, N.Y. under part number LP9K03-B3. This LED emits light in a generally Lambertian radiation pattern, as illustrated in FIGS. 3 and 4. FIG. 3 is a polar plot showing the normalized brightness values depending on the viewing angle, while FIG. 4 is a similar graphical representation on a Cartesian coordinate system. As FIGS. 3 and 4 demonstrate, maximum brightness of the emitted light occurs directly in front of the LED, with the brightness decreasing as an observer moves further away in an angular direction from the front/forward direction of the LED.

Returning to FIGS. 1 and 1A, in constructing the bulb 10 in this manner, the amount of light color-converting material that interacts with light emitted from the LED varies. At maximum brightness, there is the greatest distance between the LED 20 and the external surface 16 of the bulb 10, and light emitted from the LED 20 along the vertical axis of the bulb (x=0) will thus pass through the greatest amount of the predetermined combination of one or more fluorescent dyes, phosphorescent dyes, and/or other dyes or colorants that are mixed into the light-transmitting material. Conversely, at the bottom edge of the bulb 10, light emitted from the LED 20 will pass through a minimal amount of the fluorescent dyes, phosphorescent dyes, and/or other dyes or colorants that are mixed into the light-transmitting material. The result is a substantially consistent and generally uniform hue over the light-emitting surface 16 of the exemplary bulb 10.

For example, and referring still to FIGS. 1 and 1A, with respect to the 470-nm (blue) light-emitting diode distributed by Marktech Optoelectronics of Latham, N.Y. under part number LP9K03-B3 (referenced above), a spherical bulb 10 with a diameter, $d_1$, of approximately 12 mm and having an inner cavity 12 with a diameter, $d_2$, of approximately 5.5 mm was constructed. Applicant used Lumogen™ F240 (orange) and Lumogen™ F850 (green) fluorescent dyes and mixed them with Plexiglas® Frosted DR-66080 White TL in constructing the bulb 10 in the following proportions:

TABLE 1

|  | Mass (g) |
|---|---|
| Plexiglas ® Frosted DR-66080 White TL | 453.0 |
| Lumogen ™ F240 (orange) | 0.006 |
| Lumogen ™ F850 (green) | 0.001 |

The blue light emitted from the LED 20 was converted by the bulb 10 into a white light, with a consistent and generally uniform white hue then being observed over the light-emitting surface 16 of the exemplary bulb 10.

Furthermore, to the extent that the bulb 10 is provided with an inner cavity 12 as illustrated in FIGS. 1 and 1A, it should be recognized that inserts including one or more fluorescent dyes, phosphorescent dyes, and/or other dyes or colorants could also be received in the inner cavity 12 between the bulb 10 and the LED 20 for "tuning" the desired hue.

Finally, with respect to the exemplary bulb 10 discussed above, Applicant has recognized that the light-emitting surface 16 could be roughened, stippled, or otherwise provided with a scattering material to disrupt or prevent a lensing effect at the light-emitting surface 16 as light exits the bulb 10.

One of ordinary skill in the art will recognize that additional embodiments are possible without departing from the teachings of the present invention or the scope of the claims which follow. This detailed description, and particularly the specific details of the exemplary embodiment disclosed herein, is given primarily for clarity of understanding, and no unnecessary limitations are to be understood therefrom, for modifications will become obvious to those skilled in the art upon reading this disclosure and may be made without departing from the spirit or scope of the claimed invention.

What is claimed is:

1. A bulb adapted to fit over and around a light-emitting diode emitting a light of a first hue in a generally Lambertian radiation pattern, said bulb having a generally spherical shape and a substantially circular external cross-sectional geometry, said bulb defining an inner cavity with a substantially circular cross-sectional geometry for housing the light-emitting diode, and said bulb being composed of a substantially homogenous mixture of a light-transmitting material and a light color-converting material, said light color-converting material converting the light of the first hue into a light of a desired hue, which is then viewed along an external surface of said bulb, and wherein the light of the first hue emitted along a vertical axis of the bulb passes through a greatest amount of the light color-converting material of the substantially homogenous mixture, while the light of the first hue emitted at the bottom edge of the bulb passes through a minimal amount of the light color-converting material of the substantially homogenous mixture.

2. The bulb as recited in claim 1, wherein said light color-converting material is one or more fluorescent dyes.

3. The bulb as recited in claim 1, wherein said light color-converting material is one or more phosphorescent dyes.

4. The bulb as recited in claim 1, wherein said light color-converting material is a combination of fluorescent dyes and/or phosphorescent dyes.

5. The bulb as recited in claim 1, wherein said light-transmitting material is an acrylic resin.

6. The bulb as recited in claim 5, herein said light color-converting material is one or more fluorescent dyes mixed into said acrylic resin.

7. A lighting assembly, comprising
   a light-emitting diode emitting a light of a first hue in a generally Lambertian radiation pattern; and
   a bulb fit over and around the light-emitting diode, said bulb having a generally spherical shape and a substantially circular external cross-sectional geometry, said bulb defining an inner cavity with a substantially circular cross-sectional geometry for housing the light-emitting diode, and said bulb being composed of a substantially homogenous mixture of a light-transmitting material and a light color-converting material, said light color-converting material converting the light of the first hue into a light of a desired hue, which is then viewed along an external surface of said bulb, and wherein the light of the first hue emitted along a vertical axis of the bulb passes through a greatest amount of the light color-converting material of the substantially homogenous mixture, while the light of the first hue emitted at the bottom edge of the bulb passes through a minimal amount of the light color-converting material of the substantially homogenous mixture.

\* \* \* \* \*